United States Patent [19]

Roberts et al.

[11] Patent Number: 4,866,505
[45] Date of Patent: Sep. 12, 1989

[54] ALUMINUM-BACKED WAFER AND CHIP

[75] Inventors: Carl M. Roberts, Topsfield; John R. Saxelby, Jr., Maynard; Roger M. Moseson, Danvers, all of Mass.

[73] Assignee: Analog Devices, Inc., Norwood, Mass.

[21] Appl. No.: 220,920

[22] Filed: Jul. 18, 1988

Related U.S. Application Data

[63] Continuation of Ser. No. 841,282, Mar. 19, 1986, abandoned.

[51] Int. Cl.⁴ .................. H01L 23/54; H01L 23/48; H01L 23/12
[52] U.S. Cl. .......................... 357/71; 357/67
[58] Field of Search .................. 357/67, 71, 80, 74, 357/75

[56] References Cited

U.S. PATENT DOCUMENTS

| | | |
|---|---|---|
| 1,837,238 | 12/1931 | Siegmund . |
| 3,099,576 | 7/1963 | Mocanu . |
| 3,622,385 | 11/1971 | Stork . |
| 3,781,596 | 12/1973 | Galli et al. ................ 357/74 |
| 3,830,657 | 8/1974 | Farrar . |
| 3,925,808 | 12/1975 | Rai-Choudbury ........... 357/67 |
| 3,941,630 | 3/1976 | Larrabee . |
| 3,943,625 | 3/1976 | Brenan et al. . |
| 4,025,404 | 5/1977 | Joly et al. . |
| 4,086,375 | 4/1978 | LaChapelle, Jr. . |
| 4,089,106 | 5/1978 | Seidler . |
| 4,179,534 | 12/1979 | Chang et al. . |
| 4,293,587 | 10/1981 | Trueblood .................. 427/90 |
| 4,310,569 | 1/1982 | Harrington . |
| 4,378,902 | 4/1983 | Fedak . |
| 4,396,900 | 8/1983 | Hall . |
| 4,403,411 | 9/1983 | Patton . |
| 4,417,387 | 11/1983 | Heslop . |
| 4,441,094 | 4/1984 | Levinson . |
| 4,451,972 | 6/1984 | Batinovich . |
| 4,495,255 | 1/1985 | Draper et al. . |
| 4,554,573 | 11/1985 | Yamamoto et al. ............... 357/67 |

OTHER PUBLICATIONS

"Wafer-Chip Assembly for Large-Scale Integration"-Kraynak et al, IEEE Transactions on Electron Devices, vol. ED-15, No. 9, Sep. 1968.

*Primary Examiner*—Rolf Hille
*Assistant Examiner*—S. V. Clark
*Attorney, Agent, or Firm*—Parmelee, Bollinger & Bramblett

[57] ABSTRACT

Non-uniform compressional, thermal dissipation and thermal expansion stresses in packaged chip devices are eliminated or substantially reduced by providing an aluminum attachment layer on the back side of wafers from which the chips themselves, to be mounted in the packaged chip devices, are produced. The aluminum-backed chips produced from such aluminum-backed wafers can be attached to cavities or tabs of packages such that essentially 100% attachment or bonding contact of the chip back side to the package is obtained when the chip is attached thereto with a gold eutectic preform material.

7 Claims, 1 Drawing Sheet

ALUMINUM-BACKED WAFER AND CHIP

FIELD OF THE INVENTION

This invention relates to an aluminum-backed wafer and chip substrates produced therefrom for attachment to any lead frame package and to a process for producing same. The invention also relates to a package having an eutectic mounted aluminum-backed chip and to a method of producing such packages.

BACKGROUND OF THE INVENTION

In producing semiconductor integrated circuit chips or die for use in electronic equipment, a wafer, such as a thin insulating disc, usually silicon, having a large number of identical circuits formed on its face or top surface is first fabricated. Upon completion of wafer fabrication and after preliminary testing of each device and then severing of the wafer into individual chips, the back of each chip is mounted or secured onto a package receiving surface such as a cavity or tab of a package housing. This mounting or securing of the chip back is generally obtained by way of a thin layer of gold plating on the package cavity or tab which is used as the bonding agent. This mounting or securing is usually accomplished by heating the receiving surface of a package and by use of mild pressure and slight relative motion, called "scrubbing", between the back of the chip and the package receiving surface. Scrubbing can be accomplished by placing the back of the chip: onto the heated surface of the receiving package, onto full gold preform on the surface of the receiving package and waiting for the preform to melt, or, into previously placed and molten silicon/gold or other eutectic preform.

However, the mounting of the chip to such a package receiving surface or housing has not been entirely satisfactory for a number of reasons but especially because of the incompleteness of the bonding contact between the back side of the chip and the receiving surface of the package to which the chip is being mounted. In general only about 10 to about 70%, usually only about 20 to 30%, of the back side surface area of the chip is in bonding contact or attachment with the receiving surface of the package. This limited contact area between chip back side and receiving surface of the package produces numerous undesirable and detrimental results. For example, the limited contact area produces a mismatch in the coefficients of thermal expansion of the attached and non-attached regions of the chip back, leading to differing rates of thermal expansion across the bottom or back of the chip, thus causing or resulting in undesirable non-uniform thermal expansion stresses in the top or circuit surface regions of the chip.

Additionally, there is non-uniform thermal dissipation of heat from the chip to the package due to the partial contact of the chip to the package. Since the area of best thermal dissipation is created in the attachment region, other heat escape paths in non-attachment areas create differing and non-uniform thermal gradients throughout the chip resulting in non-uniform thermal dissipation stresses in the top surface of the chip. Moreover, while the above undesirable stresses exist in hermetic packages, they are exacerbated therein by the non-hermetic type plastic packaging, due to the compressive forces of the plastic molding compound causing the chip to bend or distort, and thus resulting in non-uniform compressional stresses on the top surface of the chip. These non-uniform stresses produced by the incomplete chip-package attachment condition mentioned result in uneven and changeable electrical performance of the chip circuit or can render the circuit inoperable for its intended purpose or lead to early failure of the chip circuit.

It would be highly desirable therefore to provide a chip which has essentially 100% attachment of the chip back side to the receiving surface of the package so that the aforementioned non-uniform thermal dissipation, compressional and thermal expansion stresses, and resulting performance drawbacks of the packaged circuits, could be avoided or substantially eliminated. It has previously been proposed that either a polymeric chip attach material, such as an epoxy or polyimide polymer, or a combination of silver and glass as a chip attach material, be employed.

However, each of these proposals themselves produce unacceptable drawbacks and problems. Polymeric chip attach materials suffer from outgas of moisture from within the polymer and eventually may result in device corrosion. To utilize the silver/glass combination as a chip attach medium, the curing of the silver/glass requires furnace processing at approximately 400° to 420° C. for several minutes. This high temperature curing causes extensive oxidation of sealing surfaces on both header and sidebraze packages, and such oxidation seriously adversely affects seal yield.

Therefore, it would be most beneficial if a chip could be provided which enables essentially 100% attachment of its back surface to the receiving surface of a package, and that such would eliminate or minimize the aforementioned deficiencies of partial chip backside attachment, while avoiding the unwanted results of a polymeric or silver/glass chip attach system.

BRIEF DESCRIPTION OF THE DRAWINGS

The invention is described in connection with the attached drawings in which.

SUMMARY OF THE INVENTION

It has been discovered that a chip which provides essentially 100% attachment of its back surface to the receiving surface of a package is provided by coating the silicon back surface of a silicon wafer, from which the chip is produced, with an attachment coating of aluminum. Individual aluminum-packed chips produced by cutting such aluminum-backed silicon wafers into chips can then be eutectically mounted to the receiving surface, such as a cavity or tab, of any suitable package, such as a metal can header, sidebraze, cerdip, plastic package or the like, for achieving essentially 100% attachment.

DETAILED DESCRIPTION OF THE INVENTION

Figure 1:
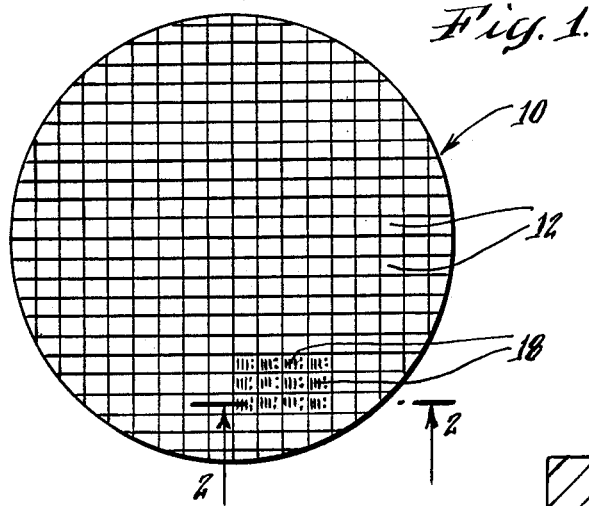
FIG. 1 is a plan view of a wafer of the invention with electronic circuits on its face.
Figure 3:
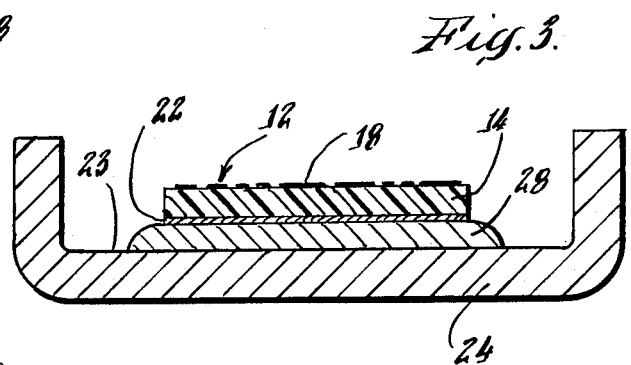
FIG. 3 is a sectional view of the chip of FIG. 2a mounted on a package surface.
Figure 2A:
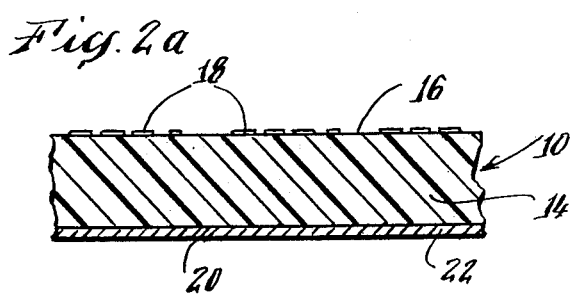
FIGS. 2a, 2b and 2c are a fractional sectional view of the chips of this invention, with parts enlarged for clarity, taken along line 2—2 of FIG. 1, showing various embodiments of the invention.
Figure 2B:
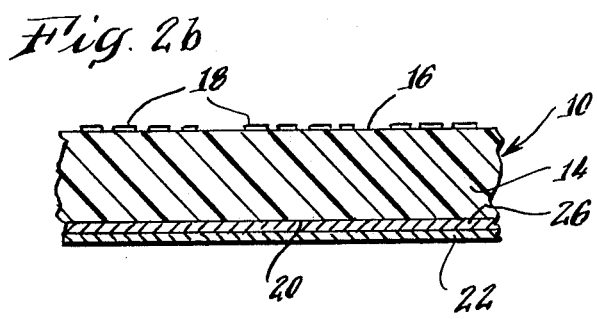

According to this invention as illustrated in FIGS. 1 through 3 a coating 22 of aluminum is deposited as an attachment coating on the back side 20, opposite the electronic circuits 18, of a wafer 10. A typical wafer may be about 5 inches in diameter and about 25 mils in thickness and be capable of being divided into 500 to 12,000 chips. Individual chips 12 are then produced from such aluminum-backed wafers by separation in a conventional manner, such as by diamond scribing, laser scribing or sawing and the like. The aluminum-backed chip produced from such aluminum-backed wafers can be mounted to a cavity or tab or other receiving surface 23 of any suitable package 24 using an eutectic preform 28, and the resulting bonding contact area between the chip back side and the receiving surface of the package will generally be in the range of from about 90 to 100%, usually at least 97 or 98%. The resulting packaged devices have virtually eliminated or significantly reduced the effects of the detrimental stresses due to non-uniform thermal expansion and thermal dissipation as well as compressional forces resulting from the prior art relatively high percentage area of non-attachment between the chip back side and the receiving surface of the package.

The package products of this invention having bonding contact areas of attachment of from 90 to 100%, and usually at least 97 or 98%, have a coefficient of expansion across the chip that is essentially equalized and normalized resulting in reduced stresses in the top or circuit side of the chip. Likewise, the packaged products of the invention provide thermal dissipation across essentially the entire back side of the attached chip essentially equalizing and normalizing thermal gradients, thereby producing a more uniform thermal gradient across the chip and thus reducing the thermally induced stresses. Similarly, due to the high degree of attachment or bonding contact between the chip back side and the receiving surface of the package, significantly reduced bending or compressional stress is obtained and compressional stresses are more uniformly equalized and normalized throughout the chip.

For example, the aluminum attachment coating on the hip back side prevents or inhibits undesirable gold diffusion into the back side of the chip. Moreover, the chip can now be attached or mounted to other materials in addition to gold, Such as for example, to copper, aluminum and nickel, thereby often eliminating the necessity for more expensive gold receiving surfaces in the packages. Since the aluminum-backed chip is mounted with a eutectic preform, preferably a silicon/gold eutectic preform, a lower temperature melt at the receiving surface of the package can be employed, and good uniform contact is obtained by scrubbing the chip and the receiving surface together. Significantly, the circuits on the chip, especially the thin film resistors on the chip, exhibit excellent matching when mounted onto a package in accordance with this invention, even after thermal cycling over the relatively large thermal range of −55° C. to 125° C. for 15 cycles, with direct exposure of the chip surface and the package. The change in resistance of resistors on chips mounted according to this invention and subject to the aforementioned relatively severe thermal cycling, measured before and after thermal cycling, was generally less than 0.003% and usually only 0.001% or less. Moreover, adhesion of the chip to the chip receiving surface of the package remained excellent, and there was no cracking or separation of the chip.

Full bonding contact between chip back side and the receiving surface of the package for aluminum-backed chips of this invention was confirmed by sawing transversely through mounted chip and package at several locations and observing full bonding contact between the chip back side and the package surface extending across the full expanse of the cut section in each instance.

In accordance with this invention aluminum is deposited as an attachment coating on the back side of a wafer. The deposition of the aluminum coating can be accomplished either before or after passivation of the wafer, although generally, and most preferably, deposition is done after passivation of the finished wafer and prior to cutting of the wafer into many individual chips. Depending on the electrical performance requirements of the intended use of the packaged product, deposition of the aluminum attachment layer on the back side of the wafer can be done with or without removal of any oxide layer built up on the wafer back side. Generally, and most preferably, the deposition of the aluminum attachment coating on the back side of the wafer is done after passivation of the wafer, and after any oxide surface has been removed from the back side of the wafer. Necessity for removal of any oxide layer from the back side can of course be avoided by preventing any oxide from originally occurring on the wafer back side before aluminizing.

If oxide is to be removed from the wafer back side before aluminum deposition, the removal can be accomplished after fabrication of the wafer or within the main wafer fabrication process. Removal of the oxide from the wafer back side can be done by conventional plasma, chemical or sputter etch techniques, for example. It will be appreciated that during removal of oxide after fabrication of the wafer, the circuit (front or top) side 16 of the wafer is to be protected by use of a photoresist deposited on the top side so as to avoid any damage thereto during etch of the wafer back side.

Deposition of the aluminum attachment layer onto the back side of a wafer, from which the oxide layer may or may not have been removed, can be accomplished by any suitable aluminum layer: for example, such as by deposition from the vapor state by evaporation, or by sputter (ion bombardment) deposition. If the oxide layer is to be removed by a sputter etch, the subsequent deposition of the aluminum layer may, if desired, be sputter deposited as part of the same vacuum process. Generally, the evaporation methods of deposition are preferred.

The thickness of the aluminum attachment layer deposited on the back side of the wafer will generally be at least 5,000 Å thick, preferably from about 10,000 to about 30,000 Å and most preferably about 15,000 Å thick.

Wafers 10, on which an aluminum attachment layer 22 has been deposited on the back side 20 thereof, are then separated into individual chips 12 for mounting onto a receiving area 22 of a package 24, such as for example, onto a cavity or onto a tab of any suitable lead frame package. Attachment or mounting of the aluminum-backed chip to the receiving area of the package is by way of an eutectic preform material 28. Mounting at about 370 to about 450° C., generally at about 380° to 425° C. and preferably at about 390° C., is obtained with a gold eutectic preform. However, other gold preforms such as for example, gold/tin, gold/germanium and gold/tin/silicon preforms and the like which cause the aluminum to bond to the package may also be employed. It has been found that a gold/silicon preform (98%/2% by weight) produces excellent bonding between the aluminum and the package. However, it is envisioned that gold/silicon preforms, wherein the weight percent of silicon is increased to 4%, 6% or the like, will provide equally satisfactory bonding.

While the receiving areas of package substrates have generally been gold, and although the aluminum bonds to such gold surfaces extremely well according to this invention, it has also been discovered that such aluminum-backed chips can be mounted to other materials which may comprise the receiving area of the package, such as for example nickel, copper, aluminum and the like, thereby eliminating the necessity for gold on the surface of the receiving area of the package.

Figure 2C:
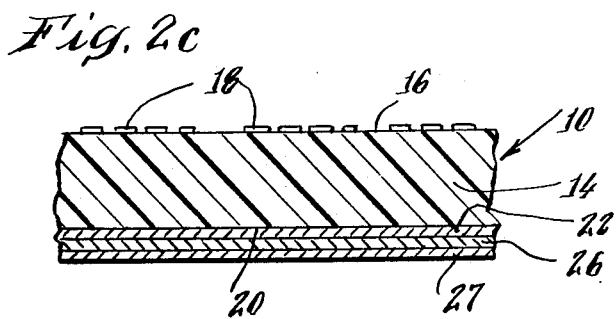

Another advantage obtained with the aluminum-backed chips of this invention is the reduction or prevention of diffusion of gold into the back side of the silicon die. Since aluminum will be absorbing or alloying with the eutectic materials, not as much or no gold is diffused into the back side of the silicon wafer or chip. If desired, a covering of the aluminum-backed wafer by an additional conductive barrier film layer of any suitable barrier material, such as titanium or tungsten or the like may be employed. As shown in FIG. 2c this additional barrier layer 26 can be deposited on the first aluminum layer 22, and then a second aluminum attachment layer 27 deposited so as to cover the barrier layer for preventing diffusion of gold into the back side of the silicon wafer. Alternatively, as illustrated in FIG. 26 a conductive barrier film layer 26 may first be deposited on the back side 20 of the silicon wafer 14 before deposition of the aluminum attachment layer 22. Prevention or substantial elimination of such undesired gold diffusion into the back side of the silicon wafer is also obtained by this invention since the presence of an aluminum attachment layer on the wafer back side allows the use of a lower temperature of the gold eutectic preform at the receiving surface of the package cavity or tab during mounting of the aluminum-backed chip.

Since removal of an oxide layer from the back side of the chip prior to aluminum layer deposition is not essential, and since removal of such an oxide layer can be achieved by various etch processes mentioned hereinbefore, it is no longer necessary to sandblast the wafer back side to do away with the oxide layer. This elimination of the sandblasting step is especially advantageous since the sandblasting procedure, in addition to being a dirty, contaminating process, also causes non-uniform stresses in the crystal structure of the silicon wafer itself, as well as causing damage, at times, to the circuits therein. With this invention, sandblasting is neither required nor necessary.

Figure 4:
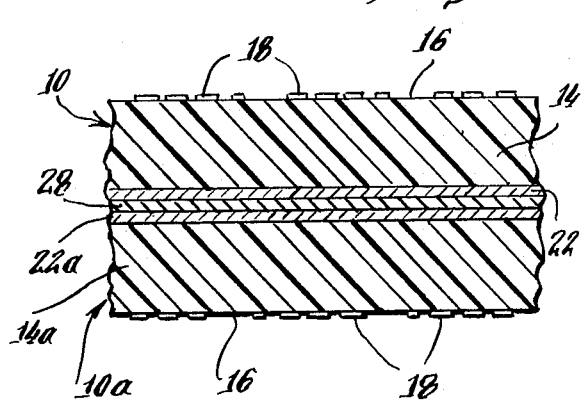
FIG. 4 is a sectional view of a further embodiment of the invention illustrating two chips of FIG. 2a mounted in back-to-back relationship.

In another embodiment of this invention, the aluminum backed circuit chips of this invention may be mounted to one another, in either back-to-back or back-to-front relationship, such as for use in sensor products or other die - die mounted products. For example, the aluminum backed side of a first chip may be etched to a pattern to match all or a portion of the circuit on the top side of a second such chip and the etched aluminum pattern of the first chip connected to all or a portion of the circuit on the top side of the second chip by way of etched vias in the first chip. Also, as illustrated in FIG. 4 the aluminum backed side 22 of a first chip 10 could be similarly mounted to the aluminum backed side 22a of a second chip 10a. Actually, attachment of the chips in front-to-back or back-to-back relationship could be accomplished, for example, by using gold preforms 28, preferably a gold/silicon preform, and conventional chip attachment or by bonding with locally applied ultrasonic or thermosonic energy or by soldering using an appropriate preform.

To better describe the wafers of this invention reference may be made to the following illustrative example.

Silicon wafers having circuits formed on the front surface thereof are fabricated according to any of the many known and varied techniques for producing same. After passivation of the wafers, the back surface of the wafers are, if desired, freed of any residual oxide by sandblasting followed by plasma or chemical etching. Thereafter, an attachment layer of aluminum of a thickness of about 15,000 Å is deposited on the wafer back side by sputtering using a Perkin Elmer 4400 sputter machine with an argon gas ambient at a pressure of about 7 microns, for example, while protecting the top surface (circuit) side of the wafer by any known protection techniques. The wafers are placed in the sputtering machinery with the top or circuit side facing down, thus shielding the front side, and the wafer back side is exposed for collection of the sputtered aluminum.

Following deposition of the aluminum attachment layer and removal of any protective coating from the top surface of the wafers, the wafers are cut into individual chips, such as for example, by wafer sawing or the like. The resulting individual aluminum-backed chip is then attached to the receiving surface of a package by way of a gold eutectic preform material, such as a gold/silicon eutectic preform. For example, the individual chip is attached to the gold cavity of a sidebraze package by a 98/2 weight percent gold/silicon eutectic preform at 390° C. by scrubbing the aluminum-backed chip into the gold cavity. Following the above-described steps achieves bonding attachment of the chip back side to the receiving area of the cavity over at least about 98% of the available surface area for attachment.

What is claimed is:

1. A packaged circuit chip comprising:
a chip substrate having a front and back surface,
said substrate front surface having a circuit with resistors formed thereon,
said chip substrate back surface having deposited thereon an attachment layer of aluminum having a thickness of from about 5,000 to about 30,000 Å,
said attachment layer of aluminum having an outer gold eutectic preform layer deposited thereon,
a package having a chip-receiving surface thereon,
said attachment layer of aluminum on the chip substrate back surface being in bonding contact with the chip-receiving surface of the package through the gold eutectic preform layer wherein the bonding contact between the chip-receiving surface and the attachment layer of aluminum is between about 90 to 100% such that the coefficient of expansion across the chip is essentially equalized such that the change in resistance of the resistors is less than about 0.003% when subjected to thermal cycling over the range of from −55° C. to 125° C. for 15 cycles and gold diffusion into the back surface of the chip is substantially prevented.

2. A packaged circuit of claim 1 wherein the gold eutectic preform layer is selected from the group consisting of gold/silicon, gold/germanium, gold/tin and gold/tin/silicon preforms.

3. A packaged circuit of claim 2 wherein said gold eutectic preform is a gold/silicon preform.

4. A packaged circuit of claim 2 wherein said gold eutectic preform is a gold/tin preform.

5. A packaged circuit of claim 2 wherein said gold eutectic preform is a gold/germanium preform.

6. A packaged circuit of claim 2 wherein said gold eutectic preform is a gold/tin/silicon preform.

7. A packaged integrated circuit of claim 3 wherein the gold/silicon eutectic preform layer comprises about 98 weight percent gold and about 2 weight percent silicon.

* * * * *